United States Patent
Cheng et al.

(10) Patent No.: US 6,737,710 B2
(45) Date of Patent: May 18, 2004

(54) TRANSISTOR STRUCTURE HAVING SILICIDE SOURCE/DRAIN EXTENSIONS

(75) Inventors: Peng Cheng, Campbell, CA (US); Brian Doyle, Cupertino, CA (US); Gang Bai, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/343,293

(22) Filed: Jun. 30, 1999

(65) Prior Publication Data

US 2002/0086505 A1 Jul. 4, 2002

(51) Int. Cl.[7] .............................................. H01L 29/76
(52) U.S. Cl. ........................ 257/382; 257/383; 257/384; 257/412; 257/413; 257/576
(58) Field of Search ................................ 257/382, 383, 257/384, 412, 413, 576

(56) References Cited

U.S. PATENT DOCUMENTS

| | | | |
|---|---|---|---|
| 4,998,150 A | | 3/1991 | Rodder et al. |
| 5,221,853 A | * | 6/1993 | Joshi et al. ............... 257/384 |
| 5,352,631 A | | 10/1994 | Sitaram et al. |
| 5,665,993 A | * | 9/1997 | Keller et al. .............. 257/377 |
| 5,710,438 A | * | 1/1998 | Oda et al. ................... 257/69 |
| 5,710,450 A | * | 1/1998 | Chau et al. ............... 257/344 |
| 5,780,896 A | * | 7/1998 | Ono ........................... 257/344 |
| 5,864,161 A | | 1/1999 | Mitani et al. |
| 5,880,500 A | * | 3/1999 | Iwata et al. ............... 257/336 |
| 5,883,418 A | * | 3/1999 | Kimura ..................... 257/412 |
| 5,937,319 A | * | 8/1999 | Xiang et al. .............. 438/486 |
| 5,937,325 A | * | 8/1999 | Ishida ....................... 438/655 |
| 5,945,719 A | * | 8/1999 | Tsuda ....................... 257/413 |
| 5,982,001 A | * | 11/1999 | Wu ........................... 257/344 |
| 6,013,569 A | * | 1/2000 | Lur et al. .................. 438/595 |
| 6,018,179 A | * | 1/2000 | Gardnet et al. ........... 257/336 |
| 6,025,241 A | * | 2/2000 | Lin et al. .................. 438/303 |
| 6,037,232 A | * | 3/2000 | Wieczorek et al. ....... 438/302 |
| 6,049,114 A | * | 4/2000 | Maiti et al. ............... 257/412 |
| 6,063,681 A | * | 5/2000 | Son .......................... 438/303 |
| 6,121,100 A | | 9/2000 | Andideh et al. |
| 6,153,455 A | * | 11/2000 | Ling et al. ................ 438/231 |
| 6,162,717 A | | 12/2000 | Yeh |
| 6,165,913 A | | 12/2000 | Lin et al. |
| 6,169,005 B1 | * | 1/2001 | Kepler et al. ............. 438/301 |
| 6,198,142 B1 | | 3/2001 | Chau et al. |
| 6,255,703 B1 | * | 7/2001 | Hause et al. .............. 257/384 |
| 6,258,646 B1 | | 7/2001 | Fulford, Jr. et al. |
| 6,274,450 B1 | * | 8/2001 | Lin et al. .................. 438/305 |

FOREIGN PATENT DOCUMENTS

| | | | | |
|---|---|---|---|---|
| JP | 02054536 A | | 2/1990 | |
| JP | 03009530 A | | 1/1991 | |
| JP | 403209771 | * | 9/1991 | ........... 257/412 |
| JP | 363133672 | * | 6/1998 | ........... 257/413 |
| JP | 404134866 | * | 6/1998 | ........... 257/412 |

* cited by examiner

Primary Examiner—Tom Thomas
Assistant Examiner—Edgardo Ortiz
(74) Attorney, Agent, or Firm—Blakely, Sokoloff, Taylor & Zafman LLP

(57) ABSTRACT

A MOSFET includes a double silicided source/drain structure wherein the source/drain terminals include a silicided source/drain extension, a deep silicided source/drain region, and a doped semiconductor portion that surrounds a portion of the source/drain structure such that the suicides are isolated from the MOSFET body node. In a further aspect of the present invention, a barrier layer is formed around a gate electrode to prevent electrical shorts between a silicided source/drain extension and the gate electrode. A deep source/drain is then formed, self-aligned to sidewall spacers that are formed subsequent to the silicidation of the source/drain extension.

13 Claims, 2 Drawing Sheets

TRANSISTOR STRUCTURE HAVING SILICIDE SOURCE/DRAIN EXTENSIONS

BACKGROUND OF THE INVENTION

1. Field of the Invention

The invention relates to the field of semiconductor integrated circuits, and more particularly relates to metal-oxide-semiconductor (MOS) field effect transistors (FETs).

2. Background

For many years integrated circuits incorporating metal-oxide-semiconductor field effect transistors (MOSFETs) have been manufactured with materials such as doped polycrystalline silicon to form the gate electrode, and doped crystalline silicon to form the source/drain terminals. Significant effort has been devoted to scaling down the physical dimensions of MOSFETs in order to increase the functionality of integrated circuits by including more transistors on each integrated circuit.

As devices were scaled down in size, there was a corresponding increase in the resistances associated with the source/drain terminals. Typically, as the linear dimensions of transistors were reduced, the depth of the source/drain terminals was reduced. The thickness of the source/drain terminals, i.e., junction depth, was reduced, as required for maintaining appropriate electrical characteristics in the scaled down MOSFETs. With thickness, that is, the junction depth, of the source/drain terminals reduced, the cross-sectional area of the source/drain terminals was reduced, which resulted in greater electrical resistance to signals propagating through the source/drain terminals.

What is needed are structures that provide low sheet resistivities for MOSFET source/drain terminals, and methods for making the same.

SUMMARY OF THE INVENTION

Briefly, a MOSFET includes a double silicided source/drain structure wherein the source/drain terminals include a silicided source/drain extension, a deep silicided source/drain region, and a doped semiconductor portion that surrounds a portion of the source/drain structure such that the silicides are isolated from the MOSFET body node.

In a further aspect of the present invention, a barrier layer is formed around a gate electrode to prevent electrical shorts between a silicided source/drain extension and the gate electrode. A deep source/drain is then formed, self-aligned to sidewall spacers that are formed subsequent to the silicidation of the source/drain extension.

DETAILED DESCRIPTION

Overview

Figure 1:
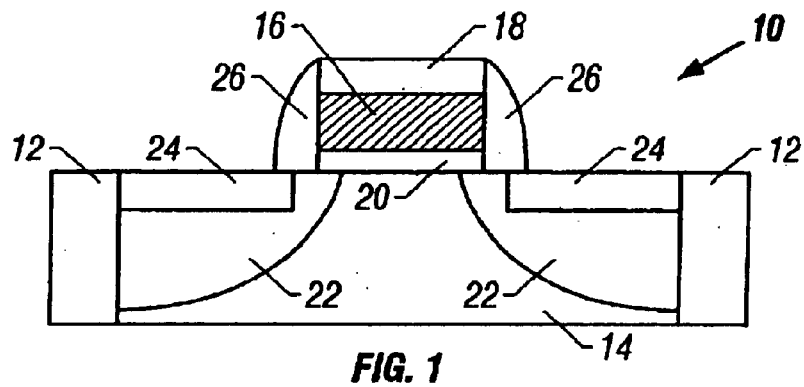
FIG. 1 is a schematic cross-sectional view of a conventional FET having sidewall spacers and a silicide layer overlying the source/drain terminals, and gate electrode.

Embodiments of the present invention provide an MOS transistor structure having silicided source/drain extensions. In contradistinction to conventional MOS transistor structures in which the source/drain extension is heavily doped, the silicided source/drain extension in embodiments of the present invention provide substantially reduced sheet resistance in the source/drain extension regions. The reduced resistance of the silicided source/drain extension in embodiments of the present invention makes it possible to significantly reduce the doping concentration in the source/drain extension region thereby reducing the lateral out-diffusion that conventionally occurs during the dopant activation process.

Terminology

The terms, chip, integrated circuit, monolithic device, semiconductor device, and microelectronic device, are often used interchangeably in this field. The present invention is applicable to all the above as they are generally understood in the field.

The term "gate" is context sensitive and can be used in two ways when describing integrated circuits. Gate refers to a circuit for realizing an arbitrary logical function when used in the context of a logic gate. However, as used herein, gate refers to the insulated gate terminal of a three terminal FET when used in the context of transistor circuit configurations or formation of transistor structures. The expression "gate terminal" is generally interchangeable with the expression "gate electrode". A FET can be viewed as a four terminal device when the semiconductor body is considered, for the purpose of describing illustrative embodiments of the present invention, the FET will be described using the traditional gate-drain-source, three terminal model.

Channel, as used herein, refers to that portion of the semiconductor body that underlies the gate dielectric, is bounded by the source/drain terminals, and is the region of the FET where current flows between the source and drain terminals.

Polycrystalline silicon is a nonporous form of silicon made up of randomly oriented crystallites or domains. Polycrystalline silicon is often formed by chemical vapor deposition from a silicon source gas or other methods and has a structure that contains large-angle grain boundaries, twin boundaries, or both. Polycrystalline silicon is often referred to in this field as polysilicon, or sometimes more simply as poly.

Source/drain terminals refer to the terminals of a FET, between which conduction occurs under the influence of an electric field, subsequent to the inversion of the semiconductor surface under the influence of a vertical electric field resulting from a voltage applied to the gate terminal. Generally, the source and drain terminals are fabricated such that they are geometrically symmetrical. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit. Typically, source/drain terminals are doped with either donor (n-type) or acceptor (p-type) atoms to create the desired electrical characteristics.

The terms wafer and substrate are generally used interchangeably in this field and are so used herein. A reference to a wafer or substrate may include a bare or pure semiconductor substrate, with or without doping, a semiconductor substrate incorporating one or more device layers at any stage of processing, other types of substrates incorporating one or more semiconductor layers, substrates having silicon on insulator (SOI), GaAs substrates, sapphire substrates, or any other substrate suitable for processing microelectronic or microelectromechanical devices.

One result of scaling down the dimensions of FETs has been an increase in, the sheet resistivities associated with the source/drain terminals. An approach commonly used to decrease the sheet resistivities of the scaled down source/drain terminals, has been to form a layer having a relatively low sheet resistivity, in parallel with the source/drain terminals. For example, various refractory metal suicides (e.g., titanium silicide) were formed over the surfaces of the source/drain terminals. In this way, the effective sheet resistivity of the source/drain terminals was reduced.

FIG. 1 illustrates a conventional FET structure having a silicided gate electrode and silicided source/drain terminals. More particularly, a FET 10 is formed between shallow trench isolation structures 12, which define an active region of the substrate 14. A gate electrode comprising a polysilicon portion 16, and a silicide portion 18 are formed over active region of the substrate 14 with a gate dielectric layer 20 disposed therebetween. Source/drain terminals, disposed in active region of the substrate 14 are disposed adjacent to the gate electrode, and include doped regions 22, and silicided regions 24. Silicide regions 24 have lower sheet resistivities as compared to doped regions 22. Physically forming silicide regions 24 superjacent doped regions 22 results in silicide region 24 being electrically in parallel with doped region 22. In this way the effective electrical resistance of the source/drain terminals is conventionally reduced compared to the resistance of the doped regions alone.

However, as FET dimensions scale down into the deep submicron region, silicidation of the source/drain terminals is not adequate to compensate for the high resistivity of the shallow source/drain extensions. One approach to reducing the limitation on transistor performance that high source/drain resistivity imposes, is to increase the doping concentration in the source/drain extensions. Unfortunately, the high doping concentration of these source/drain extensions results in out-diffusion of dopants into the channel portion of the FET, which in turn degrades the electrical performance of the transistor. Such adverse effects include undesired changes in threshold voltage, and decreased mobility due to higher scattering in the channel portion.

Embodiments of the present invention, provide FET structures with relatively low resistivity source/drain extensions, while not requiring a high doping concentration to achieve such low resistivities. More particularly, embodiments of the present invention provide FETs with metal silicide source/drain extensions. These metal silicide source/drain extensions have significantly reduced the sheet resistance in the source/drain extension region. In view of the reduced sheet resistance, the doping concentration in the source/drain extension region can be reduced, which in turn, results in reduced out-diffusion in to the channel region.

In the following description, numerous specific details are set forth such as specific materials, patterns, dimensions, etc., in order to provide a thorough understanding of the present invention. In other instances, well known materials or methods haven not been described in detail in order to avoid obscuring the invention.

Figure 2:
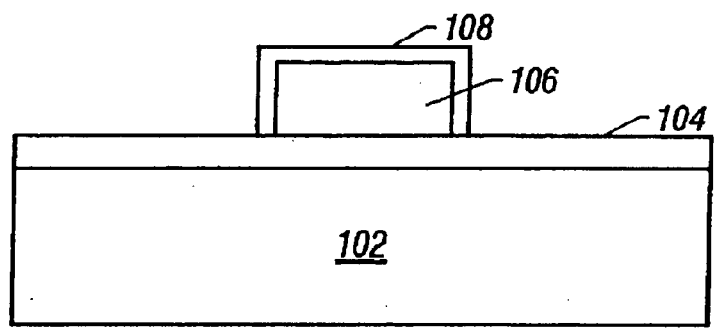
FIG. 2 is a schematic cross-sectional view of a partially fabricated FET having a patterned polysilicon gate electrode disposed over a gate dielectric layer, the gate electrode having a silicon nitride barrier layer disposed thereon.

An illustrative structure and process, each embodying the present invention are described in conjunction with FIGS. 2–7. Conventional semiconductor processing steps may be used up through the formation of patterned polysilicon disposed over a gate dielectric layer, which in turn is disposed upon a substrate. Those skilled in the art will appreciate that drawing figures are for illustration purposes and each layer shown may not be shown to scale with respect to the other layers. For example, in actual devices the substrate is much, much thicker than is shown relative the gate dielectric layer. Nonetheless those skilled in the art will readily understand the structures and process operations described in conjunction with the schematic cross-sections of FIGS. 2–7. Referring now to FIG. 2, a silicon substrate 102 has formed thereon on dielectric layer 104. Typically dielectric layer 104 may be an oxide of silicon, however the present invention is not limited to any particular material or combination of materials. For example, the present invention may be used in conjunction with dielectrics that are formed from materials such as, but not limited to, nitrides, metal oxides, rare earth oxides, or any combination thereof. As indicated in FIG. 2, a polysilicon layer is patterned to form a gate electrode 106. The deposition and patterning of polysilicon is very well known in this field. Although polysilicon is typically used to form gate electrode 106, other materials may used to form a gate electrode, and the present invention is not limited to any particular material or combination of materials to form gate electrode 106. Gate electrode 106 has a barrier layer 108 formed thereon such that the material that makes up gate electrode 106 is covered on all its sides. As shown in the schematic cross-section of FIG. 2, a top surface, and sidewall surfaces of gate electrode 106 are covered by barrier layer 108, and a bottom surface of gate electrode 106 is in contact with dielectric layer 104.

Still referring to FIG. 2, in the illustrative embodiment of the present invention, dielectric layer 104 is an oxide of silicon, gate electrode 106 is polysilicon, and barrier layer 108 is a silicon nitride layer. Nitride barrier layer 108 is formed by nitridizing polysilicon gate electrode 106. Typically, the nitride layer is very thin, for example, approximately 10 angstroms, so that it will not significantly affect the source/drain extension length. At the same time, the nitride layer should be thick enough to prevent an electrical short between a yet to be formed silicide source/drain extension structure, and the gate electrode.

Figure 3:
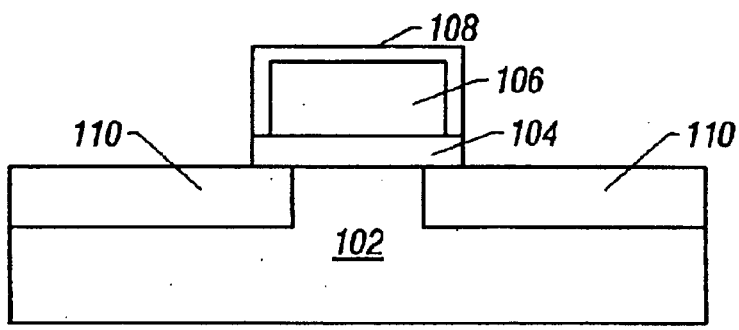
FIG. 3 is a schematic cross-sectional view of the FET of FIG. 2, wherein doped source/drain extensions have been formed in a self-aligned manner adjacent to the gate electrode.

Referring now to FIG. 3, it can be seen that a portion of dielectric layer 104 has been removed. Conventional etch techniques can be used to remove dielectric 104 where it is not covered by gate electrode 106 or barrier layer 108. Those skilled in the art will recognize that an etchant should preferentially remove dielectric 104 as compared to barrier layer 108. In this illustrative embodiment of the present invention, a ion implantation operation is performed after the dielectric layer removal operation. Ion implantation is a well known method in which impurities, sometimes referred to as dopants, are introduced into various layers of a microelectronic device in order to modify their electrical properties. The implanted dopants may be p-type or n-type depending respectively on whether a p-channel or n-channel MOSFET is being fabricated. In this instance, the ion implantation operation forms source/drain extensions 110, and is typically a shallow implant similar to those used in conventional CMOS (Complementary Metal Oxide Semiconductor) processes, however, the resulting doping concentration can be substantially less than that found in conventional source/drain extensions. In the illustrative embodiment of the present invention the doping concentration may be up to an order of magnitude lower. Those skilled in the art and having the benefit of the present disclosure will recognize that for any given implementation of the present invention, the doping concentration chosen is dependent on a number of design parameters including, but not limited to, the starting doping concentration in the substrate, the depth of the source/drain extension implant, the thermal budget for the complete process, and the nominal channel length of the MOSFET being fabricated.

Subsequent to the formation of source/drain extensions 110 by ion implantation, a dopant activation operation is performed. Dopant activation is well known in this field and typically involves heating at least portions of the substrate. During this high temperature dopant activation operation, some lateral out-diffusion from the source/drain extension into the channel region typically occurs. In embodiments of the present invention however, the amount of out-diffusion is smaller than in conventional processes because the doping concentration in the source/drain extension is substantially less. In one embodiment of the present invention, as shown in FIG. 3, the final depth of source/drain extension 110 is typically between 300 and 500 angstroms.

Figure 4:
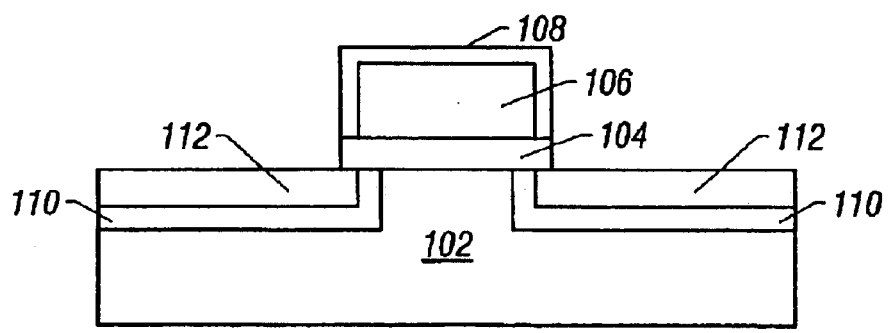
FIG. 4 is a schematic cross-sectional view of the FET of FIG. 3 after the source/drain extensions have been silicided.

Subsequent to the formation of source/drain extension 110, a first metal layer is deposited over substrate 102, such that substrate 102 as well as barrier layer 108 are covered. The first metal is typically a metal that forms a silicide when reacted with silicon. Titanium and cobalt are examples of such metals. It is preferable to use a metal which will form a silicide that is stable during a subsequent high temperature dopant activation operation. Such a dopant operation is typically performed at approximately 1000° C. Referring now to FIG. 4, the first metal layer is reacted with the exposed surface of the doped silicon regions that comprise source/drain extension 110 to form a silicide 112. As shown in FIG. 4, silicide 112 forms over source/drain extension regions 110. Reaction conditions that may be used to produce silicide 112 include rapid thermal processing at temperatures in the range of approximately 500° C.–800° C. for durations of approximately 20 seconds to 5 minutes. Barrier layer 108, a thin nitride layer in the illustrative embodiment, prevents the silicidation of polysilicon gate electrode 106 such that an electrical short between gate electrode 106 and source/drain extension 110 does not occur. The depth of silicide 112 should be less than the depth of source/drain extension 110. The lateral encroachment of silicide 112 into the channel region should be less than the length of the lateral out-diffusion of the dopants from source/drain extension 110. In other words, silicide 112 should be surrounded, in the substrate, by the doped silicon source/drain extension 110.

After silicide 112 is formed, unreacted portions of the first metal layer (not shown) are removed, typically by wet chemical etching. Removal of unreacted metal is well known in this field.

Figure 5:
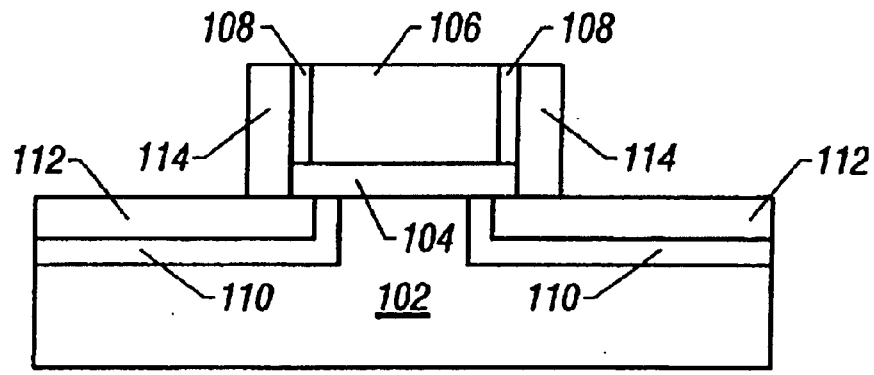
FIG. 5 is a schematic cross-sectional view of the FET of FIG. 4, after the top portion of the silicon nitride barrier has been removed and sidewall spacers have been formed.

Referring now to FIG. 5, sidewall spacers 114 are formed adjacent to barrier layer 108. Methods and materials for forming sidewall spacers are known in this field. The present invention is not limited to any particular method or materials for the formation of sidewall spacers 114. Typically, a layer of material such as silicon nitride, silicon dioxide, or a combination thereof, is deposited on the substrate; and this layer is then anisotropically etched so that portions of the layer remain adjacent to the transistor gate structure. As is further shown in FIG. 5, that portion of barrier layer 108 which is exposed after the formation sidewall spacers 114 is removed, thereby exposing a top portion of polysilicon 106.

In an alternative embodiment, barrier layer 108 may be removed prior to the formation of sidewall spacers 114 as long as the removal process does not adversely impact the characteristics of the transistor.

Figure 6:
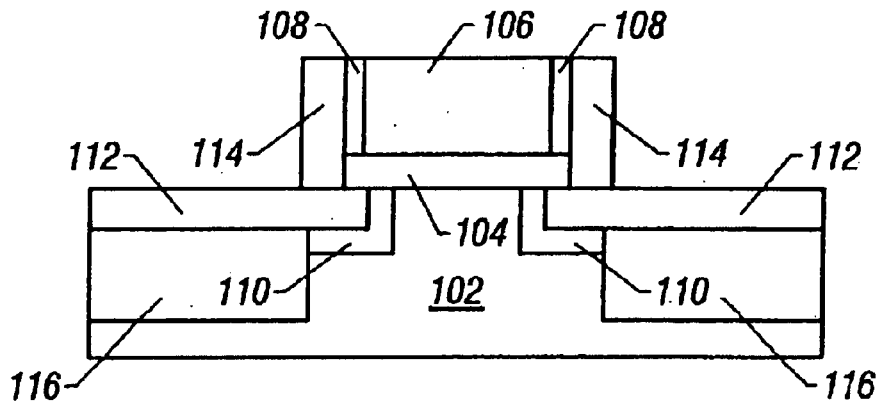
FIG. 6 is a schematic cross-sectional view of the structure of FIG. 5, after a deep source/drain junction, disposed beneath the silicided source/drain extensions, has been formed.
Figure 7:
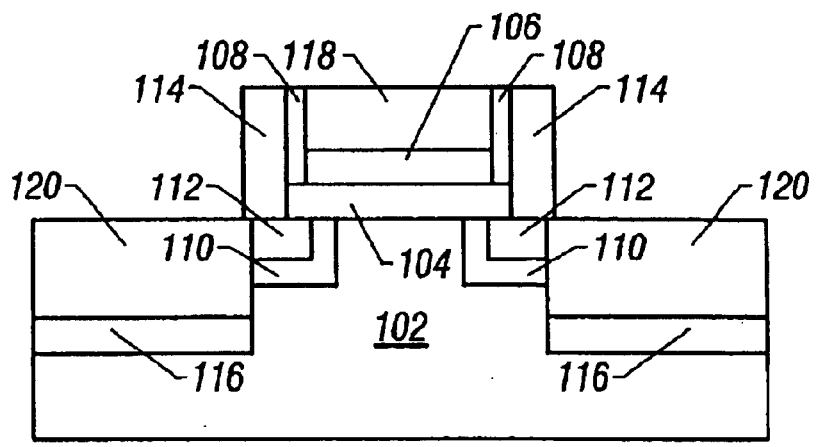
FIG. 7 is a schematic cross-sectional view of the structure of FIG. 6, after the polysilicon gate electrode has been silicided and a deep source/drain silicide layer has been formed.

Referring now to FIG. 6, source/drains 116 are formed which are self-aligned to spacers 114. Source/drains 116 are typically formed by ion implantation. Typically, n-type source/drains are formed by the implantation, and subsequent thermal activation, of arsenic or phosphorus ions. Similarly, p-type source/drains are typically formed by the implantation and subsequent thermal activation of boron ions. In this illustrative embodiment of the present invention, source/drain ion implantation is performed through silicide 112. An implant such as this may typically have a dose $4 \times 10^{15}$ atoms per $cm^2$ at an energy in the range of 1–50 keV depending on the implanted species. Furthermore, silicide 112 must be stable during the thermal activation of the source/drain dopants. The thermal activation of the source/drain dopants typically takes place at approximately 1000° C. $CoSi_2$ and $TiSi_2$ are examples of silicides that meet the required constraints.

After the activation of the source/drain dopants, a second layer of metal is deposited over the surface of the substrate. The second layer of metal may be same as, or different from the first layer of metal. The second metal is reacted with the substrate so as to form a deep silicided region 120 within source/drains 116. At substantially the same time as deep silicided region 120 is formed, polysilicon gate electrodes 106 are also silicided. It is preferable that the metal selected for use in this second silicidation reaction does not agglomerate on top of very narrow polysilicon lines. Nickel is a metal which meets this requirement and may be used to form a nickel silicide over the gate electrodes and source/drain regions.

The unreacted portions of the second metal are typically removed by a wet chemical etch. For example, a solution of $NH_4OH:H_2O_2:H_2O$ may be used to etch excess Ti.

Subsequent to removal of the unreacted portions of the second metal, conventional processing operations may be used to complete an integrated circuit including a MOSFET in accordance with the present invention.

Many variations of the processes and materials described above may be used to achieve similar end results. One alternative process may eliminate the operation in which the source/drain extension dopants are activated prior to the first silicidation operation. By eliminating this first activation operation, it is possible to achieve a sharper lateral dopant profile.

In another alternative embodiment, barrier layer 108 may be formed by a method other than the nitridation of a polysilicon gate electrode. For example, an extremely thin dielectric layer, such as approximately 10 angstroms of silicon nitride, may be deposited and an anisotropic etch operation then performed so as to form a spacer on the sides of the gate electrode. The spacer must be thick enough to prevent an electrical short between the silicided source/drain extension, and the gate electrode. The spacer must also be thin such that it does not substantially affect the length of the source/drain extension.

No limitation on the exact geometries of the various constituent parts of MOSFETs in accordance with the present invention are intended by the descriptions of illustrative embodiments herein.

Conclusion

Shallow source/drain extensions are used in scaled down MOSFETs in order to reduce the short channel effects that would otherwise occur. Conventionally, these source/drain extensions are formed from heavily doped silicon. The high level of doping in the source/drain extension is needed to reduce the sheet resistance of these structures. However, the high doping density results in significant out-diffusion during the dopant activation process. This out-diffusion adversely affects electrical performance of the MOSFET.

MOSFETs in accordance with the present invention include a silicide source/drain extension structure. A silicide source/drain extension structure can provide reduced sheet resistance as compared to conventional heavily doped Si source/drain extensions. Consequently, the silicide source/drain extension structure does not require a high doping concentration. Since a lower doping concentration can be used in the silicide source/drain extension structure in accordance with the present invention, the adverse impact of lateral out-diffusion is reduced. In turn, the reduced lateral out-diffusion provides a transistor structure that requires less overlap between the source/drain extension and the gate electrode. A benefit of the present invention is that a more scalable transistor structure is achieved.

It will be understood by those skilled in the art that many design choices are possible within the scope of the present invention. For example, metals such as Ti or Ni may be used, but in order to use Ti or Ni, a disposable spacer process should be used to avoid high temperature activation. Additionally, the present invention is not limited to silicon substrates.

It will be understood that various other changes in the details, materials, and arrangements of the parts and steps which have been described and illustrated may be made by those skilled in the art without departing from the principles and scope of the invention as expressed in the subjoined claims.

What is claimed is:

1. A microelectronic structure comprising:
   a substrate;
   a gate electrode formed over the substrate and defining an underlying channel region in the substrate, said gate electrode having a barrier layer formed on a sidewall of the gate electrode to prohibit the silicidation of the sidewall;
   a source/drain extension formed in the substrate adjacent the gate electrode and encroaching laterally into the underlying channel region a first distance, the source/drain extension having a first silicide layer formed therein, the first silicide encroaching laterally into the underlying channel region a second distance less than the first distance; and
   a source/drain region formed in the substrate adjacent the source/drain extension and having an activated doped region with a second silicide layer disposed therein, both the activated doped region and the second suicide layer are aligned with a spacer disposed along sidewalls of the gate electrode such that both the activated doped region and the second silicide layer encroach laterally into the underlying channel region a third distance due to alignment with the spacer disposed along the sidewalls, the third distance less than the second distance, said source/drain extension having less dopant concentration than the activated doped region.

2. The microelectronic structure of claim 1, wherein the activated doped region is thicker than the source/drain extension.

3. The microelectronic structure of claim 1, wherein the second suicide layer is thicker than the first suicide layer.

4. The microelectronic structure of claim 1, wherein the activated doped region and the source/drain extension comprise ion implanted material.

5. The microelectronic structure of claim 1, wherein the first and second suicide layers comprises different metals.

6. The microelectronic structure of claim 1, wherein the first and second silicide layers comprise a same metal.

7. The microelectronic structure of claim 1, wherein the second silicide layer comprises $CoSi_2$.

8. The microelectronic structure of claim 1, wherein the second silicide layer comprises $TiSi_2$.

9. The microelectronic structure of claim 1, wherein the second silicide layer comprises nickel silicide.

10. The microelectronic structure of claim 1, wherein the first silicide layer comprises $CoSi_2$.

11. The microelectronic structure of claim 1, wherein the first suicide layer comprises $TiSi_2$.

12. The microelectronic structure of claim 1, wherein the gate electrode has a third suicide layer formed on the top surface of the gate electrode.

13. The microelectronic structure of claim 1, wherein the barrier layer comprises silicon nitride.

* * * * *

UNITED STATES PATENT AND TRADEMARK OFFICE
CERTIFICATE OF CORRECTION

PATENT NO. : 6,737,710 B2
DATED : May 18, 2004
INVENTOR(S) : Cheng et al.

Page 1 of 1

It is certified that error appears in the above-identified patent and that said Letters Patent is hereby corrected as shown below:

Title page,
Item [57], ABSTRACT,
Line 5, delete "suicides" and insert -- silicides --.

Column 3,
Line 21, delete "suicides" and insert -- silicides --.

Column 8,
Lines 10, 23, 28, 41 and 43, delete "suicide" and insert -- silicide --.

Signed and Sealed this

Ninth Day of November, 2004

JON W. DUDAS
*Director of the United States Patent and Trademark Office*